United States Patent
Hause et al.

[11] Patent Number: 6,156,649
[45] Date of Patent: Dec. 5, 2000

[54] METHOD OF FORMING UNIFORM SHEET RESISTIVITY SALICIDE

[75] Inventors: Fred N. Hause; Robert Dawson; Charles E. May, all of Austin, Tex.

[73] Assignee: Advanced Micro Devices, Inc., Sunnyvale, Calif.

[21] Appl. No.: 09/060,434

[22] Filed: Apr. 14, 1998

[51] Int. Cl.[7] .......................... H01L 21/44; H01L 21/336
[52] U.S. Cl. .......................... 438/655; 438/592; 438/664; 438/683; 438/303
[58] Field of Search ........................... 438/655–657, 438/660, 663, 664, 683, 684, 685, 642, 647–649, 301, 533, 586, 360, 299, 592

[56] References Cited

U.S. PATENT DOCUMENTS

| | | | |
|---|---|---|---|
| 5,041,394 | 8/1991 | Spratt et al. | 438/533 |
| 5,226,156 | 7/1993 | Nasr | 438/384 |
| 5,449,642 | 9/1995 | Tan et al. | 438/151 |
| 5,518,960 | 5/1996 | Tsuchimoto | 438/655 |
| 5,559,047 | 9/1996 | Urabe | 438/301 |
| 5,589,417 | 12/1996 | Jeng | 438/643 |
| 5,635,426 | 6/1997 | Hayashi et al. | 438/453 |
| 5,646,070 | 7/1997 | Chung et al. | 438/644 |
| 5,679,585 | 10/1997 | Gardner et al. | 438/655 |
| 5,723,893 | 3/1998 | Yu et al. | 257/413 |
| 5,795,808 | 8/1998 | Park | 438/301 |
| 5,814,537 | 12/1998 | Maa et al. | 438/151 |
| 5,828,131 | 10/1998 | Cabral, Jr. et al. | 438/656 |
| 5,834,356 | 11/1998 | Bothra et al. | 438/384 |
| 5,834,368 | 11/1998 | Kawaguchi et al. | 438/621 |
| 5,849,634 | 12/1998 | Iwata | 438/655 |
| 5,851,891 | 12/1998 | Dawson et al. | 438/305 |
| 5,856,226 | 1/1999 | Wu | 438/291 |
| 5,856,237 | 1/1999 | Ku | 438/683 |
| 5,858,846 | 1/1999 | Tsai et al. | 438/303 |
| 5,858,849 | 1/1999 | Chen | 438/305 |
| 5,866,451 | 2/1999 | Yoo et al. | 438/241 |
| 5,883,418 | 3/1999 | Kimura | 257/412 |
| 5,907,784 | 5/1999 | Larson | 438/592 |
| 5,963,829 | 10/1999 | Matsubara | 438/649 |
| 5,972,785 | 10/1999 | Shishiguchi et al. | 438/592 |

*Primary Examiner*—Charles Bowers
*Assistant Examiner*—Thanh Nguyen
*Attorney, Agent, or Firm*—Kevin L. Daffer; Conley, Rose & Tayon

[57] ABSTRACT

A semiconductor process in which a first silicide is formed on silicon upper surfaces upon which a second silicide is selectively deposited. A refractory metal is blanket deposited on a semiconductor substrate. The semiconductor substrate is then heated to a first temperature to react portions of the refractory metal above the exposed silicon surfaces to form a first phase of a first silicide. The unreacted portions of the refractory metal then remove, typically with a wet etch process. The semiconductor substrate is then heated to a second temperature to form a second phase of the first silicide. The second temperature is typically greater than the first, and the resistivity of the second phase is less than a resistivity of the first phase. Thereafter, a second metal silicide is selectively deposited on the first silicide, preferably through the use of a chemical vapor deposition process. In one embodiment, the selectively deposited second silicide is reacted with the existing first silicide to form a composite silicide structure exhibiting uniform sheet resistivity independent of the dimensions of the underlying silicon structure.

20 Claims, 2 Drawing Sheets

METHOD OF FORMING UNIFORM SHEET RESISTIVITY SALICIDE

BACKGROUND OF THE INVENTION

1. Field of the Invention

The present invention relates to the field of semiconductor processing and more particularly to a method of forming a self aligned silicide (salicide) having a uniform sheet resistance independent of the line width.

2. Description of the Related Art

Self aligned suicides or salicide structures are well known in the art of semiconductor processing. Typically, a refractory metal is deposited upon conductive silicon structures such as the source/drain regions of the silicon substrate or the polysilicon structures used for transistor gates and local interconnects. The refractory metal is then reacted with the silicon typically by heating the silicon wafer to a predetermined temperature. The reaction between the refractory metal and the silicon typically results in the formation of a silicide structure which has a significantly lower sheet resistance than the sheet resistance of the source/drain regions or the polysilicon structures. As a result, the contact resistance between the silicide structure and a conductive contact subsequently coupled to the source/drain region or the polysilicon structure is lowered. Therefore, substantial signal propagation delay resulting from the higher contact resistance associated with conventional source/drain and polysilicon is reduced or prevented. In a conventional salicide process, a refractory metal is deposited upon an underlying topography comprising silicon and a dielectric, such as silicon dioxide. The portion of the refractory metal in close proximity to the exposed silicon is then reacted with the silicon to form a silicide while the portions of the refractory metal in close proximity to the dielectric remain unreacted. The unreacted portions of the refractory metal can then be selectively removed resulting in a silicide that is self aligned to the underlying silicon.

Despite the lower contact resistances associated with silicide processes, it has been widely observed that the sheet resistance of conventionally formed silicide varies with the line width of the structure upon which the silicide is formed. In particular, it has been observed that sheet resistivity of silicide on narrow structures (i.e., structures having smaller lateral areas) is typically greater than the sheet resistivity of silicide formed on wide silicon structures. This variation in sheet resistivity makes process simulation and circuit simulation difficult and produces undesirable variability in the fabrication process. In a conventional two-step heat treatment process for forming a conventional titanium silicide, the variability in silicide sheet resistivity may be attributed to inadequate conversion from a first phase of the silicide (C49) to a second and lower resistivity phase of the silicide (C54). Whatever the exact cause, the observed sheet resistivities of titanium silicide in very narrow line widths (e.g., less than 0.8 microns) are unacceptably high. Attempts to increase the second temperature to enhance the conversion rate to C54 silicide typically has a detrimental effect on large area features by causing, e.g., undesirable migration of impurities. Further, attempts to address the silicide sheet resistivity variability by implanting the underlying structures with a silicon implant prior to metal deposition have been met with limited success.

Selective deposition techniques in which the metal silicide is selectively deposited upon the desired silicon features have been shown to result in improved sheet resistivity uniformity across varying line widths. Unfortunately, excessive silicon consumption can occur during the selective deposition processes, resulting in an undesirable decrease migration through the junction which can lead to catastrophic failure mechanisms. In summary, numerous techniques have been unsuccessfully explored to improve silicide sheet resistivity uniformity across varying line widths without simultaneously causing a significant reduction in reliability. It would therefore be desirable to implement a self-aligned silicide process exhibiting manufacturable and reliable integrated circuits including a substantially uniform sheet resistivity independent of the local silicide dimension.

SUMMARY OF THE INVENTION

The problems identified above are in large part addressed by a semiconductor process in which a first silicide is formed on silicon upper surfaces and a second silicide is selectively deposited upon the first. The selectively deposited second silicide addresses the sheet resistivity uniformity problem while the first silicide prevents substantial silicon consumption associated with conventional selective deposition processes.

Broadly speaking, the present invention contemplates a method of forming a salicide on exposed silicon surfaces of a semiconductor substrate. A refractory metal is blanket deposited on a semiconductor substrate. The semiconductor substrate is then heated to a first temperature to react portions of the refractory metal above the exposed silicon surfaces to form a first phase of a silicide. The unreacted portions of the refractory metal are then removed, preferably with a selective wet etch process. The semiconductor substrate is then heated to a second temperature to form a second phase of the silicide. The second temperature is typically greater than the first, and the resistivity of the second phase is less than that of the first phase. Thereafter, a second metal silicide is selectively deposited on the first silicide. The second phase of the first silicide and the second silicide together form composite silicide structures which advantageously have a relatively low and uniform sheet resistivity which is independent of the dimensions of the silicide structures. The presence of the first silicide serves as a barrier over silicon-containing features of the semiconductor topography. The first silicide reduces or eliminates consumption of those silicon-containing features during the selective deposition of the second silicide. Otherwise, the depth of those silicon-containing features, e.g., the junction depth may be reduced by the silicide deposition, causing the ensuing integrated circuit to be inoperable or perform in an undesirable manner.

Preferably, the blanket deposition of the first refractory metal is accomplished with a physical vapor deposition process, such as a sputter deposition process. In a presently preferred embodiment, the sputter deposition process is accomplished using a titanium bearing target. In one embodiment, the process further includes, after the selective deposition step, heating the semiconductor substrate in a nitrogen bearing ambient maintained at a temperature in the range of approximately 450° C. to 550° C. to form a composite silicide.

The present invention still further contemplates a semiconductor fabrication process in which a polysilicon gate transistor is formed over an active region of the silicon substrate and a polysilicon interconnect is formed over an isolation region of the substrate. The formation of the transistor and the interconnect includes forming dielectric spacer structures on sidewalls of the transistor gate and the interconnect. The transistor includes a pair of heavily doped source/drain regions displaced on either side of the polysilicon gate. Upper surfaces of the polysilicon gate, the polysilicon interconnect, and the pair of source/drain regions are exposed. A first silicide is then formed on the exposed upper surfaces of the gate, the interconnect, and the pair of source/drain regions. A second silicide is selectively deposited using chemical vapor deposition upon the first silicide. The second silicide combined with the first silicide form a composite silicide structure on the upper surfaces of the gate, the interconnect, and the pair of source/drain regions. In one embodiment, the formation of the first silicide includes blanket depositing a first refractory metal on the substrate and reacting the first refractory metal with the exposed surfaces of the silicon-based substrate at a first reaction temperature to form a first phase of silicide. Thereafter, the unreacted portions of the first refractory metal are removed, preferably with a wet etch process, and the silicide is heated to second reaction temperature to form a second phase of silicide. The first reaction temperature is preferably less than approximately 475° C. while the second reaction temperature is preferably greater than approximately 500° C. Preferably, the first silicide and second silicide comprises titanium silicide.

The present invention still further contemplates a semiconductor salicidation process in which first and second conductive silicon structures are formed on a semiconductor substrate. A width of the first conductive silicon structure is greater than a width of the second silicon structure. A first silicide is then formed on upper surfaces of the first and second conductive silicon structures. Thereafter, a second metal silicide is selectively deposited on the first silicide to form a composite silicide structure on the upper surfaces of the first and second conductive silicon structures. The incorporation of the selective deposition process into the present invention results in greater sheet resistivity uniformity. Accordingly, a sheet resistivity of the composite on the first conductive silicon structure is within approximately 10% of the sheet resistivity of the composite on the second conductive silicon structure. In one embodiment, the first and second conductive silicon structures comprise heavily doped portions of the semiconductor substrate which comprises single crystalline silicon. In another embodiment, the formation of the first and second silicon structures is accomplished by chemically vapor depositing polysilicon on the semiconductor substrate, introducing an impurity distribution into the polysilicon to reduce a sheet resistivity of the polysilicon to less than approximately 500 Ω/square, forming a patterned photoresist layer on an upper surface of the polysilicon, plasma etching portions of the polysilicon layer, and removing the patterned photoresist layer. In one embodiment, the sidewalls of the first and second conductive silicon structures are covered by dielectric spacer structures.

BRIEF DESCRIPTION OF THE DRAWINGS

Further advantages of the present invention will become apparent to those skilled in the art upon reading the following description of the preferred embodiments and upon reference to the accompanying drawings in which.

Figure 1:
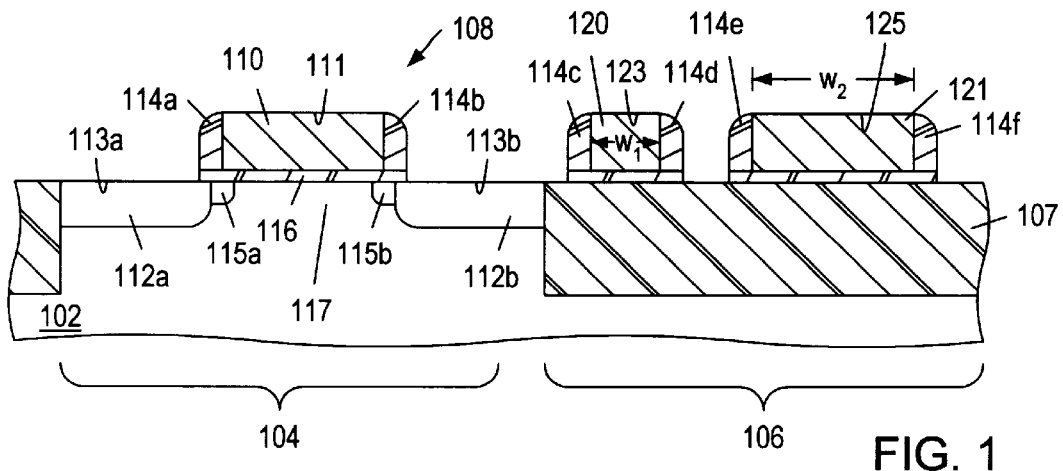
FIG. 1 is a partial cross-sectional view of a semiconductor substrate upon which a transistor has been formed over an active region and a pair of interconnects formed over an isolation region.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIGS. 1–6 show a preferred embodiment of a process for forming a composite silicide structure of a substantially uniform resistivity independent of the dimensions of the silicon structure upon which the composite silicide structure resides. FIG. 1 shows a partial cross-sectional view of a semiconductor substrate 102 preferably comprised of single crystal silicon. Semiconductor substrate 102, as shown in FIG. 1, includes active region 104 into which a transistor 108 has been fabricated and an isolation region 106 above which interconnects 120 and 121 have been formed. MOS transistor 108 includes a gate structure 110 typically comprised of polysilicon as well as a pair of source/drain regions 112a and 112b displaced on either side of transistor gate 110. Source/drain structures 112a and 112b are preferably comprised of heavily doped silicon. For purposes of this disclosure, heavily doped silicon refers to silicon that includes a net peak impurity concentration in excess of approximately $10^{19}$ atoms/cm$^3$.

Transistor gate 110 includes sidewalls upon which dielectric spacer structures 114a and 114b have been formed. In the preferred embodiment, the dielectric spacers structures 114a and 114b are comprised of a silicon oxide composite typically formed with a CVD process using a TEOS or silane source followed by an anisotropic plasma etch process. In addition to facilitating the formation of lightly doped source/drain structures, spacer structures 114 provide a contrasting material to the silicon and source/drain structures 112 and MOS transistor gate 110. This contrasting material is beneficially utilized during a subsequent silicide formation process as will be discussed in greater detail below. Transistor gate 110 resides on a thin gate dielectric layer 116. In the preferred embodiment, gate dielectric 116 comprises a thermal silicon oxide film of approximately 15 to 50 angstroms in thickness preferably formed by immersing semiconductor substrate 102 in an oxygen bearing ambient maintained at a temperature in the range of approximately 500–900° C.

FIG. 1 further shows an isolation region 106. Isolation region 106 is characterized by an isolation dielectric 107.

Isolation dielectric structures such as isolation dielectric 107 provide physical and electric separation between adjacent active regions to prevent inadvertent coupling of neighboring active regions. Isolation dielectric 107, as shown in FIG. 1, comprises a shallow trench isolation dielectric material such as CVD silicon dioxide. In a shallow trench isolation process, an isolation trench is etched into the silicon surface and, thereafter, the trench is filled with a deposited oxide. Subsequent to the deposition of the oxide, excess oxide is typically removed from regions exterior to the isolation trench with any number of planarization steps including chemical mechanical polishing as well as resist/etch back techniques. Those familiar with semiconductor fabrication will recognize that alternative isolation structures such as field oxides using an LOCOS process may be suitably substituted for the shallow trench isolation structure shown in FIG. 1.

A first interconnect 120 and a second interconnect 121 are shown as being fabricated on isolation dielectric structure 107. First interconnect 120 has a first width dimension $w_1$ while second interconnect 121 has a second dimension $w_2$. In the preferred embodiment, first interconnect 120 and second interconnect 121 comprise polysilicon deposited and formed simultaneously with the formation of transistor gate 110. In a typical polysilicon formation process, silane is thermally decomposed in a chemical vapor deposition reactor chamber maintained at a temperature in the range of approximately 589° C. to 650° C. The CVD polysilicon is typically doped with an impurity such as phosphorous, arsenic, or boron to reduce the sheet resistivity of the polysilicon to less than approximately 500 Ω/square. While the doping of polysilicon can be accomplished in situ or subsequent to the deposition with a furnace type diffusion process, the preferred method of introducing the impurity distribution into the polysilicon is through the use of an ion implantation process.

After the formation of the polysilicon structures, source/drain structures comprising the heavily doped source/drain regions 112a and 112b and lightly doped regions 115a and 115b are formed. In the preferred process, the lightly doped regions 115a and 115b are fabricated by implanting a lightly doped impurity distribution into the semiconductor substrate using an ion implantation process with an implant dose less than approximately $1 \times 10^{15}$ atoms/cm$^2$ and an implant energy of less than approximately 100 keV. The shallow and lightly doped regions 115 are beneficial in deep sub-micron transistors because they tend to reduce the maximum electric field generated in transistor channel 117 when the drain is biased during normal circuit operation. The reduction of the maximum electric field advantageously reduces the occurrence of hot electron injection into gate dielectric 116, thereby increasing the reliability and lifetime of the device.

After the lightly doped regions 115 have been introduced into the semiconductor substrate 102, spacer structures 114a, 114b, 114c, 114d, 114e, and 114f (collectively referred to as spacer structures 114) are formed on the respective sidewalls of the polysilicon structures 110, 120, and 121. Formation of spacer structures 114 is preferably accomplished with chemical vapor deposition of a conformal dielectric, such as a silicon dioxide composite formed with a plasma enhanced CVD process using a TEOS or silane source as is well known in the field of semiconductor fabrication. Subsequent to the deposition of the conformal dielectric layer, an anisotropic plasma etch process is performed which results in the removal of all portions of the conformal dielectric layer except those portions adjacent to vertical structures such as the sidewalls of the silicon structures 110, 120, and 121.

Spacer structures serve dual purposes in a sub-micron silicide process. First, the spacer structures provide a mask during subsequent ion implantation process in which a heavily doped impurity distribution is introduced into the heavily doped regions 112a and 112b. The spacer structure mask beneficially displaces the heavily doped regions 112a and 112b from the channel region 117 of transistor 108 to accomplish the beneficial reduction in maximum electric field proximal to the channel region 117 discussed previously. Second, spacer structures 114 provide a surface upon which a subsequently deposited refractory metal will not substantially react during a subsequent heat process as will be discussed in greater detail below. This characteristic of the spacer structures is beneficial in producing selectively deposited or self aligned silicide structures.

After the formation of spacer structures 114, a heavily doped impurity distribution is introduced into heavily doped regions 112a and 112b of transistor 108. In the preferred embodiment, the heavily doped regions include impurities of arsenic or phosphorous in the case of an n-channel type transistor or boron in the case of a p-channel type transistor wherein an implant dose is typically in excess of greater than approximately $1 \times 10^{15}$ atoms/cm$^2$, and wherein an implant energy is typically in the range of approximately 20 to 500 keV. The formation of transistor 108 is typically completed by subjecting transistor 108 to a high temperature process to electrically activate the implanted ions within semiconductor substrate 102.

Figure 2:
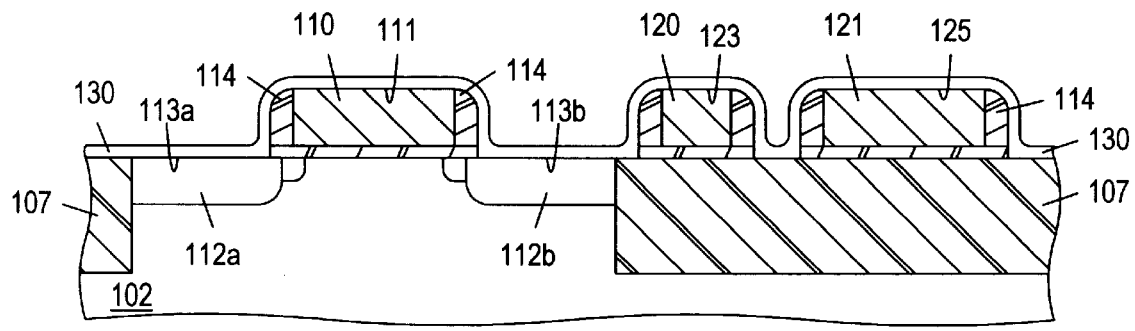
FIG. 2 is a processing step subsequent to FIG. 1 in which a first refractory metal is deposited over the semiconductor substrate topography.

Turning now to FIG. 2, a first refractory metal 130 is blanket deposited over the topography comprising an upper surface of semiconductor substrate 102 and the conductive silicon structures 110, 120, and 121. For purposes of this disclosure, a refractory metal is defined as an element or alloy having a melting point in the range of approximately 1300° C. to 1700° C., including nickel, palladium, platinum, cobalt, titanium, and appropriate alloys thereof. In the preferred process, the blanket deposition is accomplished by a physical vapor deposition process such as a sputter deposition in which a target comprising the refractory metal, e.g., a titanium target is bombarded with energetic ions to release particles of the refractory metal which are then induced onto the topography of the semiconductor substrate with an appropriate electrical field under appropriate temperature and pressure conditions. The blanket deposition results in a refractory metal layer 130 that is in contact with a silicon bearing surface in various regions of the semiconductor substrate topography. In particular, refractory metal layer 130 is in contact with an upper surface 113a and 113b of heavily doped regions 112a and 112b. Refractory metal layer 130 is also in contact with upper surfaces 111, 123, and 125 of respective conductive polysilicon structures 110, 120, and 121. Portions of refractory metal layer 130 are also in contact with non-silicon or dielectric surfaces. Examples of these interfaces include an interface between refractory metal layer 130 and spacer structures 114 as well as an interface between refractory metal layer 130 and isolation structure 107.

Figure 3:
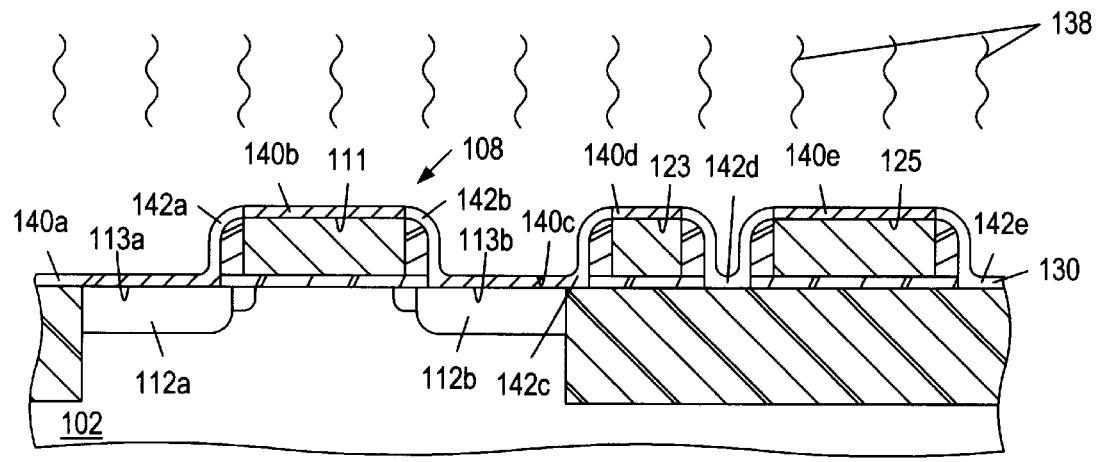
FIG. 3 is a processing step subsequent to FIG. 2 in which the first refractory metal is reacted with underlying silicon in the semiconductor substrate and in the polysilicon gates and interconnects to form a first phase of a silicide.

Turning now to FIG. 3, a high temperature process 138 is performed to react the portions of refractory metal layer 130 in contact with silicon. More specifically, the high temperature process 138 results in the formation of reacted portions 140 and unreacted portions 142 of refractory metal layer 130. The reacted portions 140 of refractory metal layer 130 include those portions of layer 130 in contact with silicon. These portions occur at the interfaces 111, 113, 123, and 125, as shown in FIG. 3.

In an embodiment of the present invention in which refractory metal layer 130 comprises titanium, the preferred process for forming the first reaction between the refractory metal layer 130 and underlying silicon is accomplished with a temperature sufficient to produce the necessary reaction without producing a reaction between the portions 142 of refractory metal layer 130 in contact with an underlying dielectric. In a preferred process, high temperature sequence 138 is accomplished by immersing semiconductor substrate 102 into an ambient maintained at a temperature of less than approximately 475° C. The reacted portions of refractory metal layer 130 comprise self-aligned regions 140 of titanium silicide ($TiSi_2$). The titanium silicide regions 140 provide a low resistivity layer upon the underlying heavily doped regions 112*a* and 112*b* and the polysilicon structures 110, 120, and 121. A benefit of the first titanium silicide regions 140 is the prevention of substantial silicon consumption during subsequent processing steps. It is known in prior art processes that the formation of a silicide structure upon a bare silicon surface at elevated temperatures may result in consumption of the underlying silicon that can result in a detrimental decrease in the depth of heavily doped regions 112*a* and 112*b*, thereby rendering transistor 108 inoperable. The benefits of the low resistivity characteristics of reacted portions 140 include reduced contact resistance thereby resulting in higher speed and more efficient devices.

Figure 4:
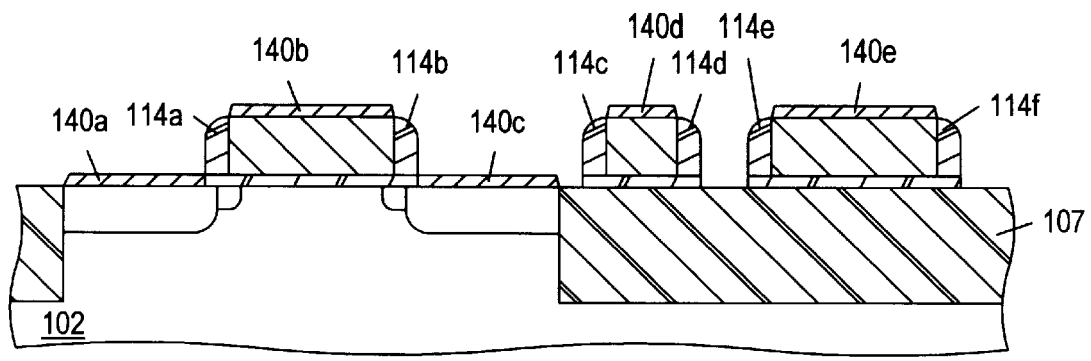
FIG. 4 is a processing step subsequent to FIG. 3 in which the unreacted portions of the first silicide are removed.

Turning now to FIG. 4, unreacted portions 142 of refractory metal layer 130 are removed with a selective etch process such as a wet etch process designed to selectively etch the unreacted portions 142 of refractory metal layer 130. In an embodiment of the present invention in which the reacted portions 140 comprise titanium silicide and the unreacted portions comprise titanium, a suitable etch process includes the immersion of semiconductor substrate 102 into a wet solution comprising $H_2O$, $H_2O_2$, and $NH_4OH$ in an approximate ratio of 5:1:1. In this manner, the reacted portions 140 of refractory metal layer 130 are self aligned with underlying silicon structures.

Figure 5:
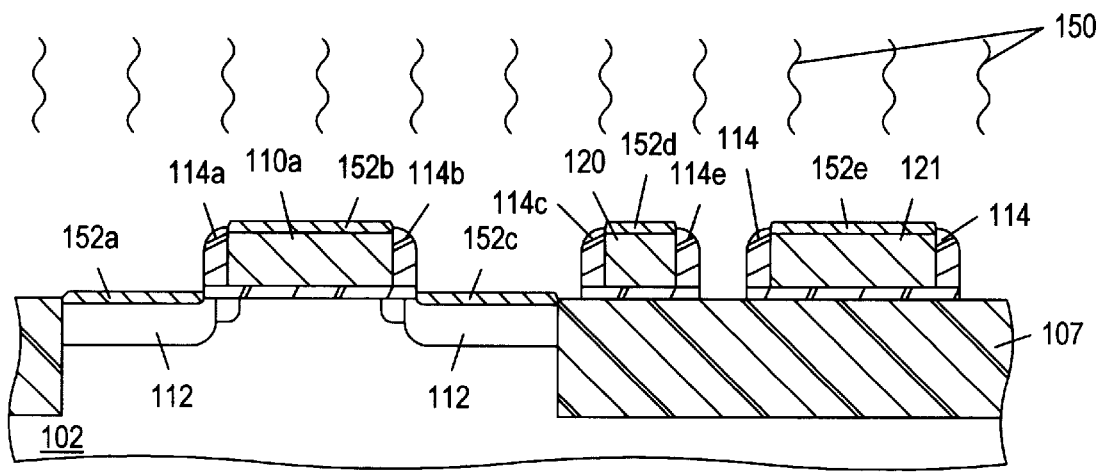
FIG. 5 is a processing step subsequent to FIG. 4 in which the semiconductor substrate is heated to form a second phase of a silicide over exposed silicon portions of the semiconductor substrate and the polysilicon gates and interconnects; and, FIG. 6 is a processing step subsequent to FIG. 5 in which a second refractory metal is selectively deposited over the first silicide structure.

Turning now to FIG. 5, a second high temperature process 150 is executed to further react the self-aligned silicide with the underlying silicon to produce a second phase 152 of the silicide. In an embodiment of the present invention in which the refractory metal comprises titanium, a first phase of the silicide is formed according to FIG. 3. This phase of the silicide structure, while suitable for achieving a selective etch, is undesirable in that a resistivity of the first phase of the silicide is typically in excess of a desired value. The formation of the second phase 152 of the silicide through high temperature process 150 is known, in embodiments comprising titanium, to produce a second phase of the silicide which has a desirably lower resistivity value suitable for use in deep submicron VLSI integrated circuits. In embodiments of the present invention in which the refractory metal comprises titanium, the high temperature process 150 is preferably performed at a temperature greater than approximately 500° C. and still more preferably at a temperature of approximately 550° C.

Figure 6:
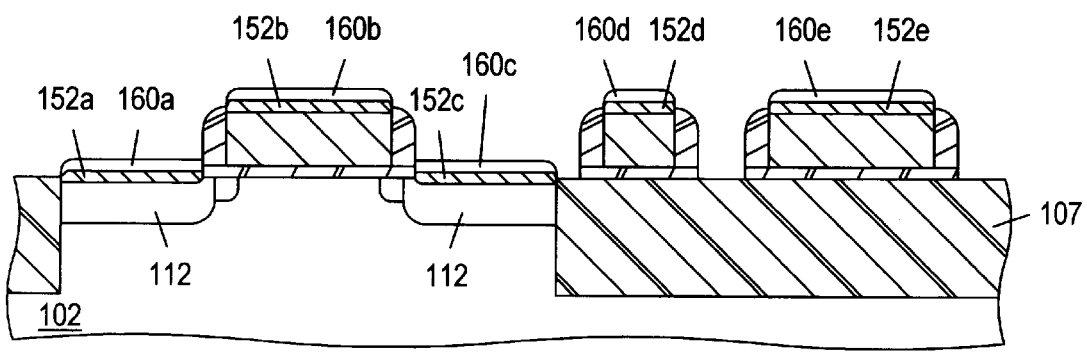

Turning now to FIG. 6, a second metal silicide 160 is selectively deposited over the second phase 152 of the silicide structure. In one embodiment, titanium silicide is chemically vapor deposited exclusively upon the underlying first silicide from a titanium and silicon bearing source gas within a chamber maintained at a temperature of approximately 400° C. to 600° C. and a pressure of less than approximately 2 torr. Titanium silicide may alternately be sputter deposited from a titanium silicide target. A masking layer, e.g., photoresist may be formed upon regions of the semiconductor topography exclusive of first silicide 152 prior to the deposition of titanium. Thereafter, the masking layer and excess titanium silicide formed across the surface of the masking layer may be removed such that titanium silicide regions 160*a*, 160*b*, 160*c*, 160*d*, and 160*e* remain exclusively upon first silicide regions 152*a*, 152*b*, 152*c*, 152*d*, and 152*e*.

The semiconductor topography may subsequently be heated in a nitrogen bearing ambient to a temperature in the range of approximately 450° C. to 550° C. to form a composite refractory metal silicide structure comprising the second phase of first silicide 152 as well as the selectively deposited second silicide 160. This high temperature processing step may cause the first silicide 152 to react with the underlying second silicide 160. The selective deposition of a second metal silicide 160 across the underlying silicide beneficially results in the formation of composite silicide structures having a uniform resistivity across varying dimensions. The second phase of the first silicide 152 is necessary to prevent excessive consumption of the underlying heavily doped regions 112 during the selective deposition of second silicide 160. Therefore, it will be appreciated to those skilled in the art that the combination of a self-aligned first silicide structure formed according to the process sequence shown in FIGS. 2–5 coupled with the selective deposition of a second silicide structure achieves the desirable goal of uniform sheet resistivity without subjecting the underlying heavily doped regions 112 to excessive consumption that may result in device failure. In one embodiment, a subsequent high temperature step may be performed to react second refractory material 160 with the underlying second phase 152 of the first silicide resulting in the formation of a composite silicide structure selectively formed and self aligned to underlying silicon structures in a semiconductor substrate.

It will be appreciated to those skilled in fabrication practices that various modifications and changes may be made without departing from the spirit and scope of the invention as set forth in the claims. It is intended that the following claims be interpreted to embrace all such modifications and changes. The specification and drawings are to be regarded in an illustrative rather than a restrictive sense.

What is claimed is:

1. A method of forming a salicide structure on an exposed silicon surface of a semiconductor topography, said method comprising:

blanket depositing a refractory metal on said semiconductor topography;

heating said semiconductor topography to a first temperature to react portions of said refractory metal in contact with said exposed silicon surface to selectively form a first phase of a first silicide upon said exposed silicon surface;

heating said semiconductor topography to a second temperature to form a second phase of said first silicide;

removing unreacted portions of said refractory metal; and selectively depositing a second silicide upon said first silicide.

2. The process of claim 1, wherein said second temperature is greater than said first temperature, and wherein a resistivity of said second phase is less than a resistivity of said first phase.

3. The process of claim 1, wherein said blanket depositing comprises sputter depositing from a titanium bearing target.

4. The process of claim 1, wherein said selective depositing comprises chemically vapor depositing said second silicide.

5. The process of claim 4, wherein said chemically vapor depositing is accomplished in a CVD reactor chamber maintained at a temperature of approximately 400 to 600° C. and a pressure of less than approximately 2 torr.

6. The process of claim 5, wherein said CVD reactor chamber comprises a silicon and titanium bearing gas.

7. The process of claim 6, wherein said second refractory metal comprises titanium.

8. The process of claim 1, further comprising, after said selectively depositing, heating said semiconductor topography in a nitrogen bearing ambient maintained at a temperature in the range of approximately 450 to 550° C.

9. A method for forming an integrated circuit, comprising:
   forming a polysilicon gate transistor over an active region of a semiconductor substrate and a polysilicon interconnect over an isolation region of said semiconductor substrate, said forming a polysilicon gate transistor including forming dielectric spacer structures on sidewalls of said transistor gate and said polysilicon interconnect, said transistor including a pair of junctions displaced on either side of said polysilicon gate, wherein upper surfaces of said polysilicon gate, said polysilicon interconnect, and pair of junctions are exposed;
   forming a first silicide upon said exposed upper surfaces of said polysilicon gate, said polysilicon interconnect, and said pair of junctions; and
   depositing a second silicide selectively upon said first silicide to form a composite silicide structure upon said upper surfaces of said polysilicon gate, said polysilicon interconnect, and said pair of junctions;
   wherein said forming the first silicide comprises:
      blanket depositing a first refractory metal on said semiconductor substrate;
      reacting said first refractory metal with said exposed upper surfaces at a first reaction temperature to form a first phase of said first silicide over said exposed upper surfaces;
      removing unreacted portions of said first refractory metal; and
      heating said first phase of said first silicide to a second reaction temperature to form a second phase of said first silicide having a lower resistivity than said first phase.

10. The process of claim 9, wherein said first refractory metal comprises titanium.

11. The process of claim 9, wherein said first reaction temperature is less than approximately 475° C., and further wherein said second reaction temperature is greater than approximately 500° C.

12. The process of claim 9, wherein said selectively depositing said second silicide comprises chemically vapor depositing titanium silicide.

13. The process of claim 9, further comprising heating said first silicide and said second silicide to a temperature of approximately 450 to 550° C. to promote said forming of the composite silicide structure.

14. A semiconductor salicidation process comprising:
   forming first and second conductive silicon structures on a semiconductor substrate, wherein a width of said first conductive silicon structure is greater than a width of said second silicon structure;
   forming a first silicide on upper surfaces of said first and second conductive silicon structures; and
   selectively depositing a second silicide on said first silicide to form a composite silicide structure on upper surfaces of said first and second conductive silicon structures, wherein a sheet resistivity of said composite on said first conductive silicon structure is within approximately 10% of a sheet resistivity of said composite on said second conductive silicon structure.

15. The process of claim 14, wherein said first and second conductive silicon structures comprise heavily doped portions of said semiconductor substrate, and wherein said semiconductor substrate comprises single crystalline silicon.

16. The process of claim 14, wherein said forming said first and second conductive silicon structures comprises:
   chemically vapor depositing polysilicon across said semiconductor substrate;
   introducing an impurity distribution into said polysilicon to reduce a sheet resistivity of said polysilicon to less than approximately 500 ohms/square;
   forming a patterned photoresist layer on an upper surface of said polysilicon;
   plasma etching said polysilicon layer; and
   removing said patterned photoresist layer.

17. The process of claim 14, wherein sidewalls of said first and second conductive silicon structures are covered by dielectric spacer structures.

18. The process of claim 14, wherein the step of forming said first silicide comprises:
   blanket depositing a refractory metal over upper surfaces of said first and second silicon structures;
   heating said semiconductor substrate to a first temperature to react portions of said refractory metal in contact with said exposed silicon surfaces to form a first phase of a first silicide;
   removing unreacted portions of said refractory metal; and
   heating said semiconductor substrate to a second temperature to form a second phase of said first silicide wherein said second temperature is greater than said first and wherein a resistivity of said second phase is less than a resistivity of said first phase.

19. The process of claim 18, wherein said first temperature is less than approximately 475° C., and further wherein said second temperature is greater than approximately 500° C.

20. The process of claim 18, wherein said first silicide and said second silicide comprise titanium silicide.

* * * * *